(12) United States Patent
Ziglioli (10) Patent No.: US 9,708,174 B2
(45) Date of Patent: Jul. 18, 2017

(54) PROCESS FOR MANUFACTURING A PACKAGED DEVICE, IN PARTICULAR A PACKAGED MICRO-ELECTRO-MECHANICAL SENSOR, HAVING AN ACCESSIBLE STRUCTURE, SUCH AS A MEMS MICROPHONE AND PACKAGED DEVICE OBTAINED THEREBY

(71) Applicant: STMicroelectronics S.r.l., Agrate Brianza (IT)

(72) Inventor: Federico Giovanni Ziglioli, Pozzo d'Adda (IT)

(73) Assignee: STMICROELECTRONICS S.R.L., Agrate Brianza (IT)

(*) Notice: Subject to any disclaimer, the term of this patent is extended or adjusted under 35 U.S.C. 154(b) by 0 days.

(21) Appl. No.: 14/341,458

(22) Filed: Jul. 25, 2014

(65) Prior Publication Data

US 2015/0035091 A1 Feb. 5, 2015

(30) Foreign Application Priority Data

Jul. 31, 2013 (IT) ................. TO2013A0651

(51) Int. Cl.
*B81B 3/00* (2006.01)
*B81C 1/00* (2006.01)
(Continued)

(52) U.S. Cl.
CPC ........ *B81B 3/0021* (2013.01); *B81C 1/00269* (2013.01); *H01L 24/97* (2013.01);
(Continued)

(58) Field of Classification Search
CPC .......... B81B 3/0021; B81B 2201/0257; B81B 2201/047; B81C 1/00269;
(Continued)

(56) References Cited

U.S. PATENT DOCUMENTS 8,324,007 B2    12/2012  Ziglioli et al.
2007/0040231 A1* 2/2007  Harney ............... B81B 7/007
                                        257/415
(Continued)

FOREIGN PATENT DOCUMENTS

CN    101142672 A    3/2008
CN    101241897 A    8/2008
(Continued)

*Primary Examiner* — Thanh T Nguyen (74) *Attorney, Agent, or Firm* — Seed Intellectual Property Law Group LLP (57) ABSTRACT

In order to manufacture a packaged device, a die having a sensitive region is bonded to a support, and a packaging mass of moldable material is molded on the support so as to surround the die. During molding of the packaging mass, a chamber is formed, which faces the sensitive region and is connected to the outside environment. To this end, a sacrificial mass of material that may evaporate/sublimate is dispensed on the sensitive region; the packaging mass is molded on the sacrificial mass; a through hole is formed in the packaging mass to extend as far as the sacrificial mass; the sacrificial mass is evaporated/sublimated through the hole.

25 Claims, 10 Drawing Sheets

(51) Int. Cl.
*H04R 19/00* (2006.01)
*H01L 23/00* (2006.01)
*H01L 25/00* (2006.01)
*H01L 23/31* (2006.01)

(52) U.S. Cl.
CPC .... *H04R 19/005* (2013.01); *B81B 2201/0257* (2013.01); *B81C 2203/0118* (2013.01); *B81C 2203/0154* (2013.01); *H01L 23/3142* (2013.01); *H01L 25/50* (2013.01); *H01L 2924/181* (2013.01)

(58) Field of Classification Search
CPC ..... B81C 2203/0118; B81C 2203/0154; B81C 1/00333; H01L 24/97; H01L 2924/181; H01L 2924/00012; H01L 25/50; H01L 23/3142; H01L 2924/16152; H01L 2924/146; H01L 27/14618; H01L 31/0203; H01L 2224/48091; H01L 2224/48247; H01L 2224/48465; H01L 2224/49107; H01L 2924/14; H01L 2924/1461; H01L 2924/1815; H01L 2924/00; H01L 2224/48137; H01L 2924/16151; H04R 19/005; G01L 19/141
USPC .................................................. 257/415, 622
See application file for complete search history.

(56) References Cited

U.S. PATENT DOCUMENTS

| | | | |
|---|---|---|---|
| 2007/0222008 A1* | 9/2007 | Chen | B81C 1/00896 257/415 |
| 2008/0157236 A1* | 7/2008 | Chen | G01L 19/141 257/415 |
| 2010/0284553 A1* | 11/2010 | Conti | B81B 7/0061 381/174 |
| 2011/0038493 A1 | 2/2011 | Li | |
| 2011/0062573 A1* | 3/2011 | Zhe | B81C 1/00301 257/680 |
| 2011/0156176 A1 | 6/2011 | Huckabee et al. | |
| 2011/0233737 A1 | 9/2011 | Yoon et al. | |
| 2012/0175747 A1* | 7/2012 | Schlarmann | B81C 1/00309 257/622 |
| 2013/0119489 A1 | 5/2013 | Chang et al. | |

FOREIGN PATENT DOCUMENTS

| | | |
|---|---|---|
| CN | 101554987 A | 10/2009 |
| CN | 101643193 A | 2/2010 |
| CN | 102001616 A | 4/2011 |
| CN | 102295263 A | 12/2011 |
| EP | 1 898 668 A2 | 3/2008 |
| JP | 2009/60055 A | 3/2009 |
| JP | 2010-41565 A | 2/2010 |
| WO | 2008/089969 A2 | 7/2008 |

* cited by examiner

PROCESS FOR MANUFACTURING A PACKAGED DEVICE, IN PARTICULAR A PACKAGED MICRO-ELECTRO-MECHANICAL SENSOR, HAVING AN ACCESSIBLE STRUCTURE, SUCH AS A MEMS MICROPHONE AND PACKAGED DEVICE OBTAINED THEREBY

BACKGROUND

Technical Field

The present disclosure relates to a process for manufacturing a packaged device, in particular a packaged micro-electro-mechanical (MEMS) sensor, having an accessible structure, such as a MEMS microphone, and to the packaged device obtained thereby.

DETAILED DESCRIPTION

As is known, a MEMS sensor, for instance, an acoustic transducer, such as a capacitive microphone, generally comprises a micro-mechanical sensing structure, designed to convert a mechanical stress (e.g., acoustic pressure waves) into an electrical quantity (for example, for an acoustic transducer having a capacitive structure, variations of the electrical quantity caused by the acoustic pressure waves in the capacitive structure are exploited). Moreover, the sensor may comprise read electronics, designed to carry out appropriate processing operations (including amplification and filtering) of the electrical quantity to output an electrical signal (e.g., a voltage).

In general, the MEMS sensor is formed in a die including a body or structural layer of semiconductor material, for example, silicon. The die may contain a cavity and may define a flexible membrane or diaphragm. For instance, for the acoustic transducer indicated above, the flexible membrane is subject to deformation as a function of the pressure of the incident acoustic waves.

The die implementing the acoustic transducer is enclosed in a package, which may contain also the associated reading electronics, for example, in the form of an application specific integrated circuit (ASIC), in turn integrated in a respective die of semiconductor material.

In this type of sensor, the sensing structure (membrane) is connected to the outside world so as to be able to detect quantities such as the pressure of the acoustic waves.

In practice, the membrane is suspended between a reference back chamber and a front chamber connected to the outside world and has appropriate shape and dimensions so as to ensure the frequency response in use.

Various types of packages are known, which enable connection to the outside environment.

Typically, for MEMS devices, pre-molded metal or plastic caps are used, and fixed to a support of the MEMS die, for example a printed-circuit board. In some embodiments, these caps have the shape of lids having a top surface and side walls so as to delimit a chamber housing the MEMS device. The lids are fixed to the support through a strip of adhesive material arranged between the support and the bottom edge of the cap, facing the support. The adhesive material may be a conductive glue, for example a conductive epoxy resin so as to obtain also a ground connection towards the support, if desired. A hole, generally in the top surface, enables connection between the chamber housing the die and the outside environment.

Alternatively, the support of the MEMS die may have a cavity housing the die and closed at the top by a planar cap. Also in this case, the cap is fixed to the support through a strip of adhesive material that extends over the edge of the substrate that delimits the cavity.

These known solutions may undergo improvements. In particular, if the cap is a pre-molded cap, specific and dedicated molding tools (comprising, for example, molds and punches) are utilized, for each variation of dimensions and shapes, for example, in the case of variations of the dimensions of the silicon or in presence of different specifications of the customer. In addition, the pitch and layout of the molding and punching tools are not always compatible with the dimensions and configuration of the contact array.

Furthermore, the package obtained with the cap is not always sufficiently resistant and, in particular operating conditions, especially in presence of vibrations or in case of impact or fall of the sensor, may detach from the support.

The same type of problem is shared by MEMS devices of different types, where a sensitive part formed above or in the die is connected with the outside for sensing chemical substances, such as gases, humidity, and odors of various types.

BRIEF SUMMARY

According to one or more embodiments of the present disclosure there is provided a process for manufacturing a packaged device and the packaged device thus obtained.

In one embodiment, a fully molded package is formed above a support and forms, during molding, a chamber or cavity connected with the outside environment via a through hole. The chamber or cavity may face a portion of the die, such the sensitive portion of the die, or surround the die at the top and laterally. By creating the cavity during molding, a cap is obtained directly on the support via standard molding steps with reliable and repeatable results so that the resulting package is inexpensive and very sturdy. Furthermore, the creation of the cavity or chamber by evaporation/sublimation of a suitable mass of material (which thus operates as a "mold" for the cavity/chamber during molding of the package) enables structuring of the chamber so that it has dimensions suited for the particular application, which is particularly important in the case of a MEMS microphone.

The use of a material able to sublimate/evaporate after forming an access hole through the package enables freeing the chamber in a simple and economically advantageous way, without the need for complex or costly removal operations.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

Figure 1:
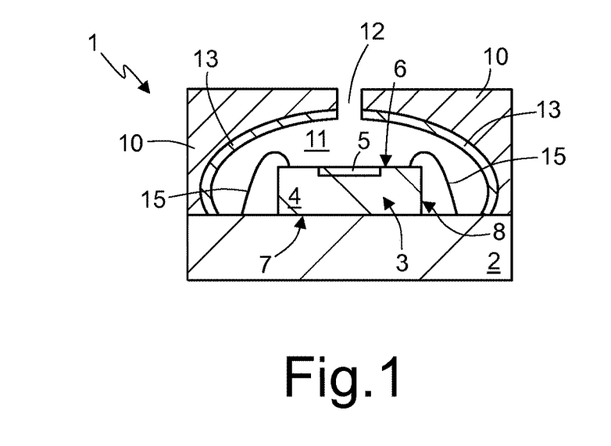
FIG. 1 shows a cross-section through an embodiment of a packaged device.

FIG. 1 shows an integrated device 1 comprising a support 2 carrying a die 3. The die 3 is formed by a body 4 that typically has a parallelepipedal shape with a first main face 6, a second main face 7, and a side surface 8. The body 4 is typically formed by a structural layer of semiconductor material, such as silicon, and conductive/insulating layers (not shown) may extend thereover. The die 3 is bonded to the support 2 at the second main face 7 (bottom surface) and has a sensitive area 5 facing the first main face 6 (top surface). The sensitive area 5 may be formed within or above the first main face 6 of the body 4, as described in greater detail hereinafter. For instance, the sensitive area 5 may be a membrane or diaphragm delimited at the bottom by a buried cavity in the body, or a suspended membrane, or may comprise one or more layers extending over the first main face 6.

The support 2 has a parallelepipedal shape with an area or base greater than that of the die 3. A packaging mass 10 is formed on the support 2, laterally and on top of the die 3. The packaging mass 10 delimits a chamber or cavity 11, which is empty and, in the example of the embodiment of FIG. 1, houses the die 3. A barrier layer 13 extends over the walls of the chamber 11, and electrical connection wires 15 connect the die 3 to the support 2. Through paths and connections (not shown) connect the electrical connection wires 15 to the back of the support 2, in a known manner.

The chamber 11 is connected to the outside world via a hole 12 extending through the packaging mass 10 and the barrier layer 13. In the embodiment shown, the hole 12 vertically overlies the sensitive area 5 and thus the chamber 11, but could be laterally offset or arranged in any suitable position and configuration.

The support 2 may be of any known type. For instance, the support 2 may be a printed-circuit board (PCB) of organic material or other organic multilayer substrate (such as, for example, a layer of bismaleimide triazine—BT) for example of a land-grid array (LGA) or ball-grid-array (BGA) type. Alternatively, the support 2 may be a supporting die of semiconductor material, typically silicon.

The packaging mass 10, which forms a molded package, is of standard material for molded packages, typically plastic material, such as resin.

The barrier layer 13 may be of low-viscosity polymeric material or a conductive material, typically metal, for example, a conductive ink that may be applied via ink-spray coating or via aerosol jetting of conductive ink, for example with a silver or gold, or some other material normally used for silk-screen printing paths on a substrate. The barrier layer 13 is rather thin; for example, it may have a thickness between 20 and 50 µm. The barrier layer may be useful during the manufacturing steps (as described in detail hereinafter) and may have a disturbance shielding function during operation of the packaged device 1.

The chamber 11 is obtained by removing a sacrificial material that is able to evaporate/sublimate without leaving residue, as described in detail hereinafter, according to one of the possible embodiments of the manufacturing process.

With reference to FIGS. 2-7 an embodiment of a process for manufacturing the packaged device 1 of FIG. 1 is now described.

Figure 2:
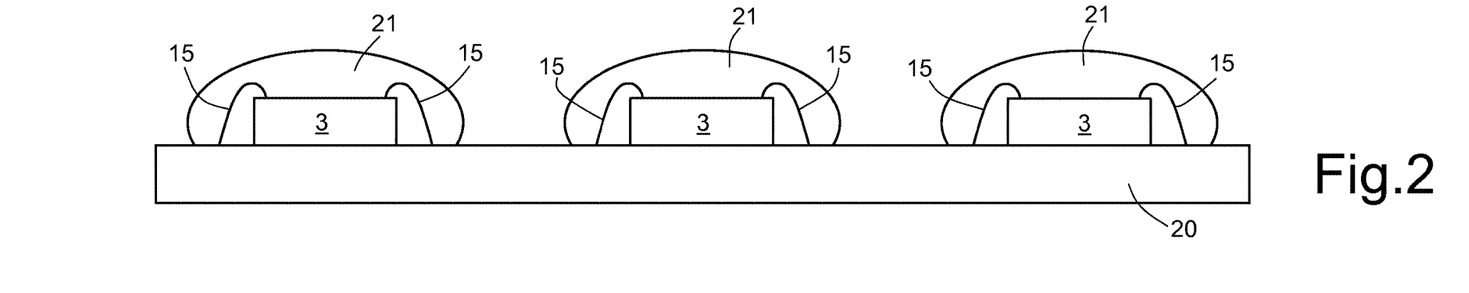
FIGS. 2-7 show cross-sections of a structure during successive steps for simultaneously packaging a plurality of devices, in one embodiment of the present process.

In detail, FIG. 2 shows a plate-like substrate 20 bearing a plurality of dice 3, for example bonded via adhesive material (not shown). The dice 3 are electrically connected to the plate-like substrate 20 via the respective electrical connection wires 15. A sacrificial drop 21, of a material that may evaporate or sublimate without dissoluting, having a wax-like consistency, such as a meltable hydrocarbon, is dispensed on each die 3. For instance, the material of the sacrificial drops 21 may be a polymer that may be dispensed at operating temperature and then sublimated. The material may be of a type that may be dispensed at room temperature and may sublimate slowly, possibly at a controlled temperature and/or in controlled conditions, possibly after a curing treatment.

In particular, the material of the sacrificial drops 21 may be a short-chain polymer, such as a polymer with naphthalene, cyclododecane, anthracene, pyrene, perylene, and zinc acetate, that are either in pure form or dissolved in non-polar organic solvents.

In the example shown in FIG. 2, each sacrificial drop 21 completely covers and envelops a respective die 3, including the electrical connection wires 15.

Next (FIG. 3), the barrier layer 13 is applied on each sacrificial drop 21 and, if dispensed with a suitable viscosity, as known to the person skilled in the art, completely coats the respective sacrificial drop 21, without substantially coming into contact with the substrate 20. After application, the material of the sacrificial drops 21 may be cured at room temperature (RT curing) for example for a time between 10 min and 60 min, or by ultraviolet radiation, in either case to evaporate the solvent.

Next (FIG. 4), compression molding of a standard type is carried out, and a package layer 23, for example of resin, completely covers the plate-like substrate 20, embedding the dice 3, the sacrificial drops 21, and the corresponding barrier layers 13. In this step, the barrier layer 13 may prevent mixing between the material of the package layer 23 and the material of the sacrificial drop 21.

Figure 5:
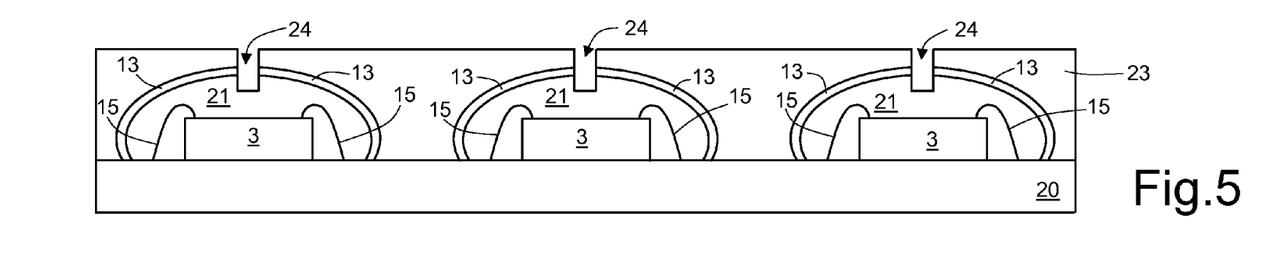

As shown in FIG. 5, perforation is carried out, and a plurality of holes 24 are made through the package layer 23, one hole for each die 23. In particular, each hole 24 extends through the package layer 23 and the barrier layer as far as the sacrificial drop 21. For instance, perforation may be carried out by laser drilling. It is to be appreciated by those skilled in the art that in another embodiment, the holes 24 are made during the molding process.

Figure 6:
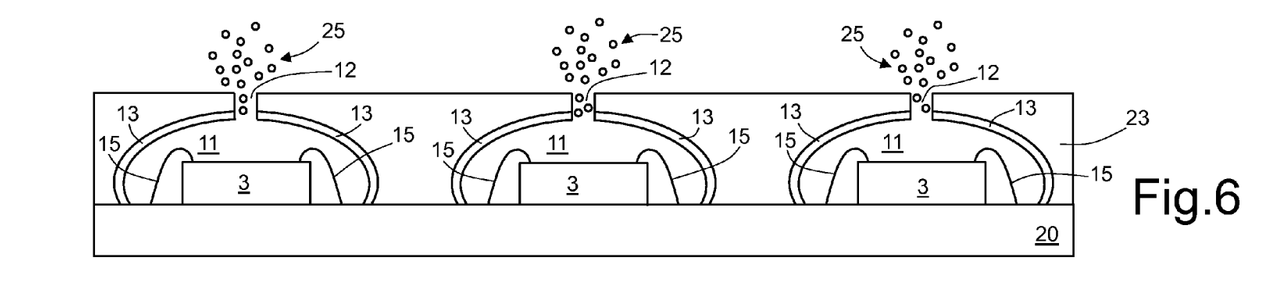

Then the sacrificial drops 21 are evaporated or sublimated, to form the chambers 11 (FIG. 6). According to the material used, evaporation or sublimation may be carried out in an oven (e.g., at 100° C.-200° C.), at room temperature, at ambient pressure, or else at low pressure, and may last between 10 minutes and an hour. In this condition, the material of the sacrificial drops 21 evaporates or sublimates, and the gas that is formed (represented schematically in FIG. 6 by particles 25) comes out through the holes 24, leaving the chambers 11 empty or substantially empty (meaning that they are filled with ambient gas). Also in this step, in particular in case of evaporation or sublimation of the sacrificial drops 21 at a temperature higher than room temperature, the barrier layer 13 prevents possible mixing between the materials of the sacrificial drops and of the package layer 23 during any possible solid-to-liquid transition. In the package layer 23 and in the barrier layer 13 there thus remain the holes 12.

Figure 7:
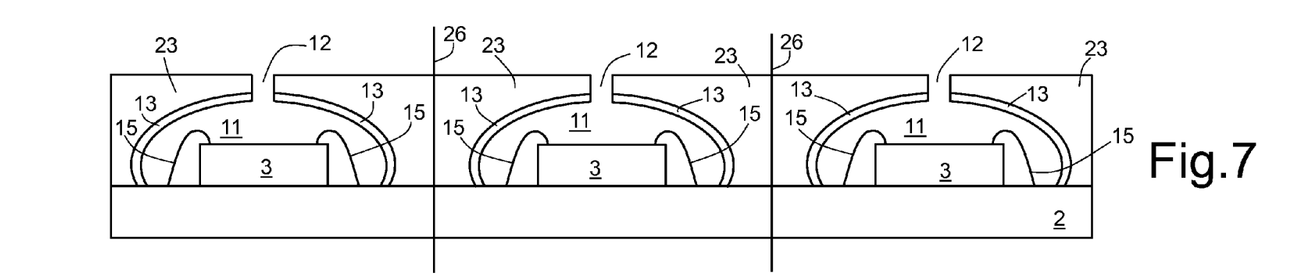

The structure thus obtained is then cut ("singulation") using standard techniques, as represented schematically in FIG. 7 by vertical lines 26. A plurality of packaged devices 1 is thus formed, as shown in FIG. 1.

In this way, the final devices are provided with a fully molded package that may be manufactured at lower costs as compared to solutions that use purposely designed caps. The packaged device is moreover more resistant than known solutions. In addition, the use of technologies (molding) used in an extensive way in the technology of semiconductors ensures a high reliability of the obtained devices.

Figure 8:
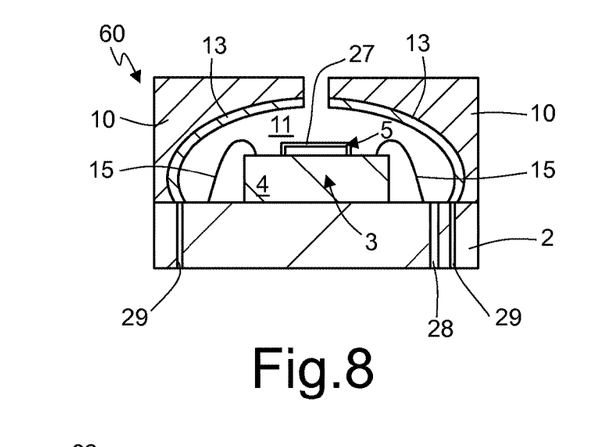
FIGS. 8-10 show different devices that may be obtained with the process of FIGS. 2-7.

FIG. 8 shows a packaged device 60, where the sensitive area is formed by a membrane 27 suspended over the top surface 6 of the body 4. FIG. 8 also shows a conductive via 28 connected, by a path (not represented), to one of the electrical connection wires 15, and through vias 29 electrically connected to the barrier layer 13, for its biasing, for example, to ground. This solution is particularly suitable, for example, for providing a MEMS microphone, even though the packaged device 60 may be an actuator/sensor of different type.

Figure 9:
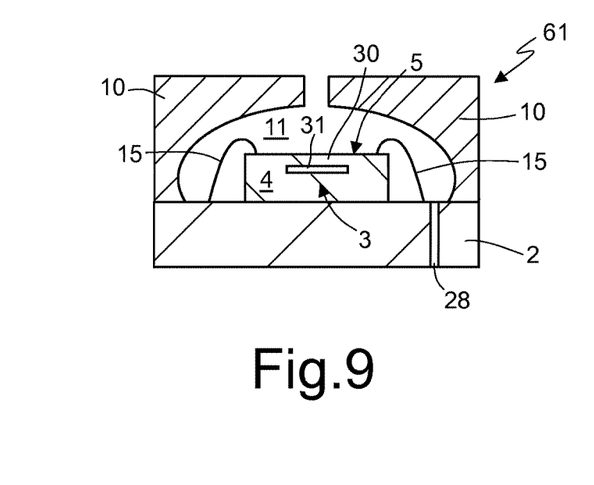

FIG. 9 shows a packaged device 61, where the sensitive area is formed by a membrane 30 formed within the body 4 of the die 3. A buried cavity 31 delimits, at the bottom, the membrane 30, which is thus monolithic (and is thus made of the same material as the body 4 of the die 3 and has the same crystallographic structure as the surface portion thereof). This solution is particularly suitable, for example, for providing a capacitive-type MEMS pressure sensor, even though the packaged device 61 may be an actuator/sensor of different type (e.g., a capacitive humidity sensor) or be based on a different sensing principle (for example, of a piezoelectric type). Furthermore, the membrane 30, instead of being delimited by a buried cavity 31, may be delimited by a cavity (not shown) formed with the bulk-micromachining technology and extending from the back of the die 3 (second main face 7 of the die 3, bonded to the support 2).

Figure 3:
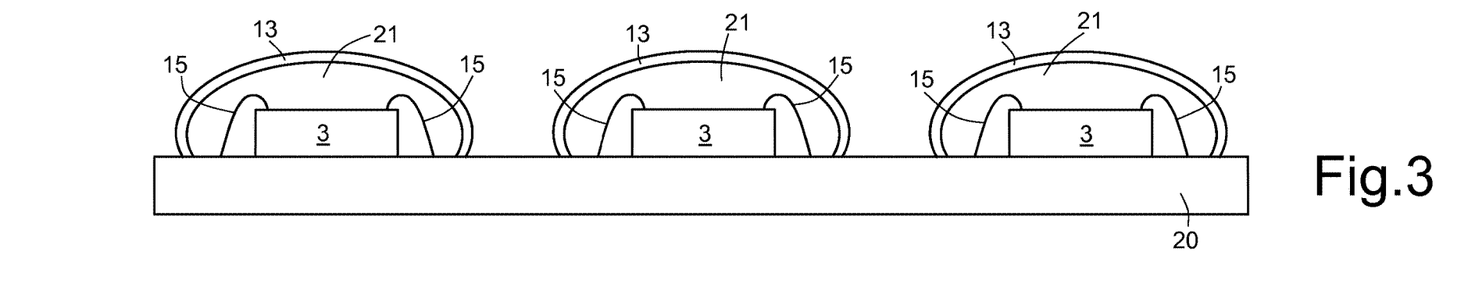
Figure 4:
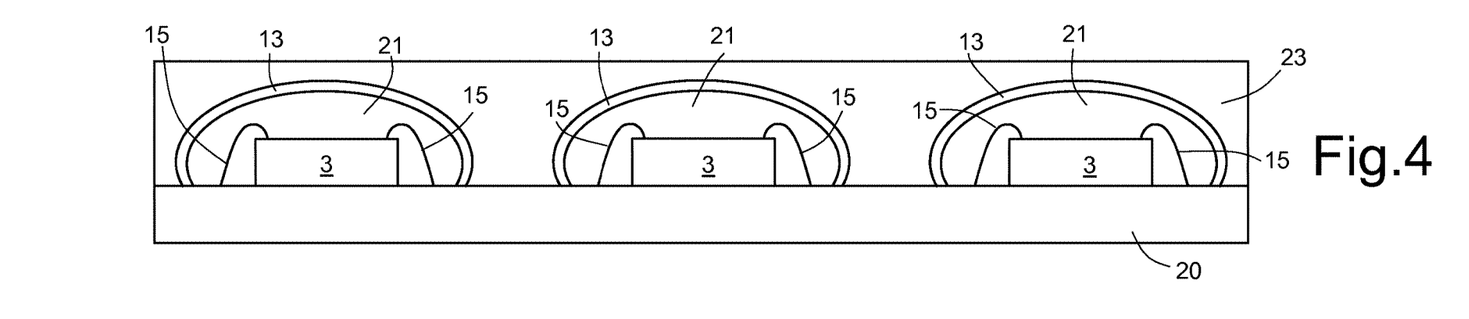

Furthermore, in FIG. 9, no barrier layer 13 is present. In this case, the manufacturing process is similar to the one described above with reference to FIGS. 2, 4-7, but no application of the barrier layer of FIG. 3 is performed.

Obviously, according to another variant, it is possible to provide a packaged device without the barrier layer as in FIG. 9, but having a suspended membrane 27 as in FIG. 8.

Figure 10:
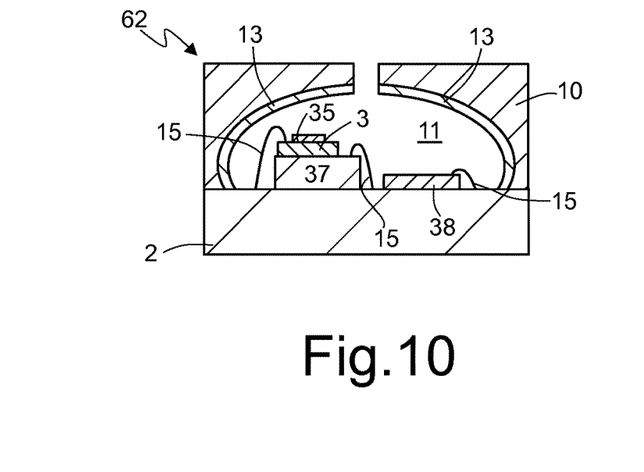

FIG. 10 shows an integrated device 62, where the sensitive area is formed by a sensitive layer 35 overlying the top surface 6 of the die 3. This solution, for example, is particularly suitable for providing a gas sensor or a sensor for detecting other chemical substances, where the sensitive layer 35 is optimized according to the matter to be detected (for example, it comprises a porphyrin), even though the packaged device 62 may an actuator/sensor of different type.

Moreover, in FIG. 10, the die 3 is mounted on a second die 37, for example an integrated circuit, such as a ASIC. A third die 38 is bonded to the support 2, alongside the second die 37. The die 3, the second die 37, and the third die 38 are all housed in the chamber 11.

Obviously, according to another variant, the number of dice within a same chamber 11 and/or their mutual position (all stacked on top of each other, all arranged alongside each other, or in part arranged on top of one another and in part arranged alongside one another) may vary, being limited by considerations of strength of the packaging mass 10 given the size of the chamber 11. Furthermore, also the implementation of the sensitive area 5 may vary, and may comprise, instead of a sensitive layer 35 overlying the top surface 6, a suspended or integrated membrane, and the barrier layer 13 may be provided or not.

Figure 11:
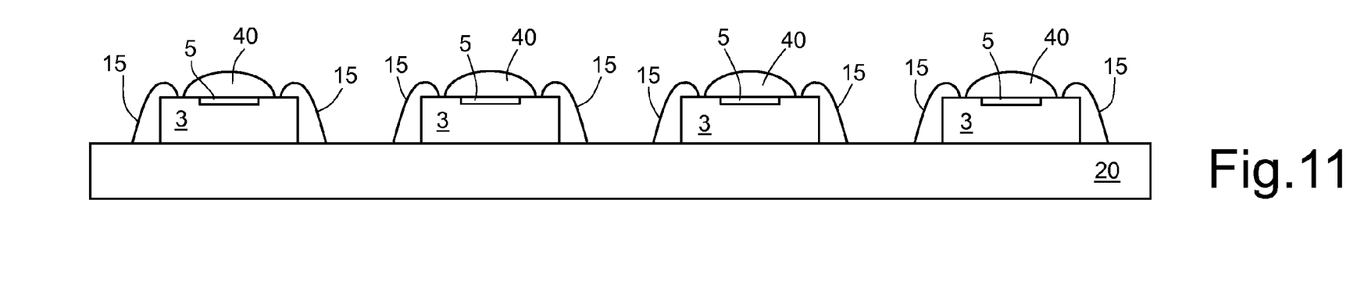
FIGS. 11-15 show cross-sections of a structure during successive steps for simultaneously packaging a plurality of devices, according to a different embodiment of the present process.
Figure 12:
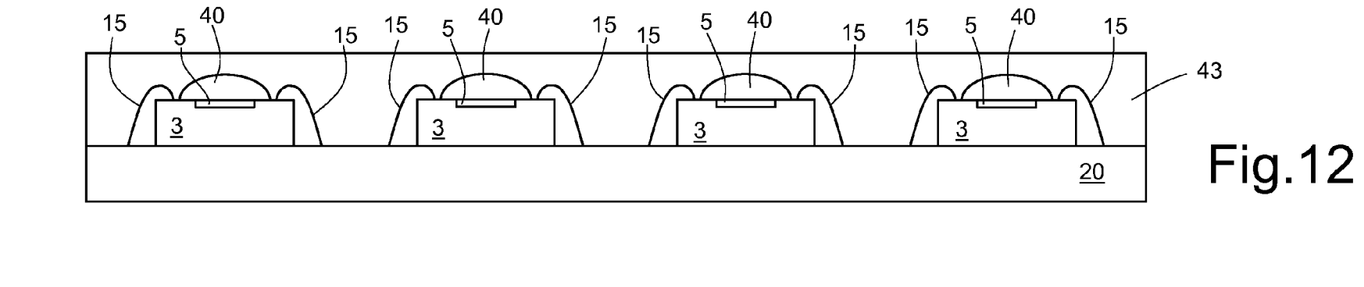
Figure 13:
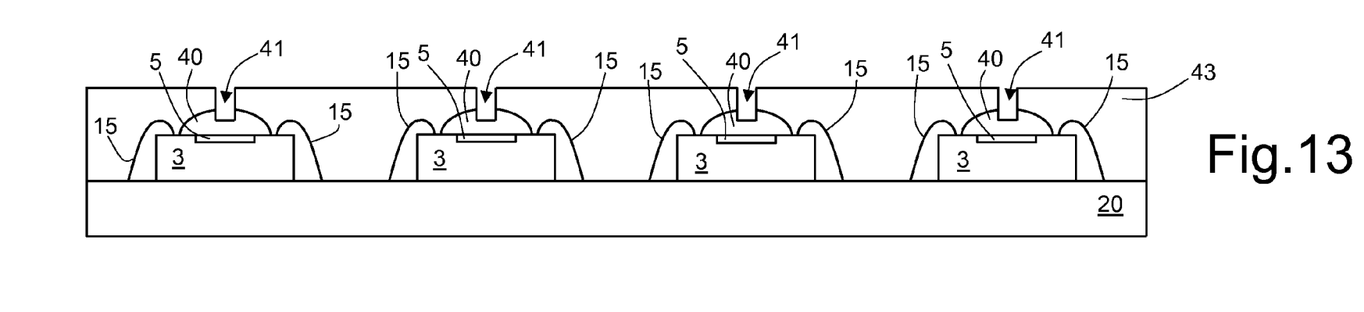
Figure 14:
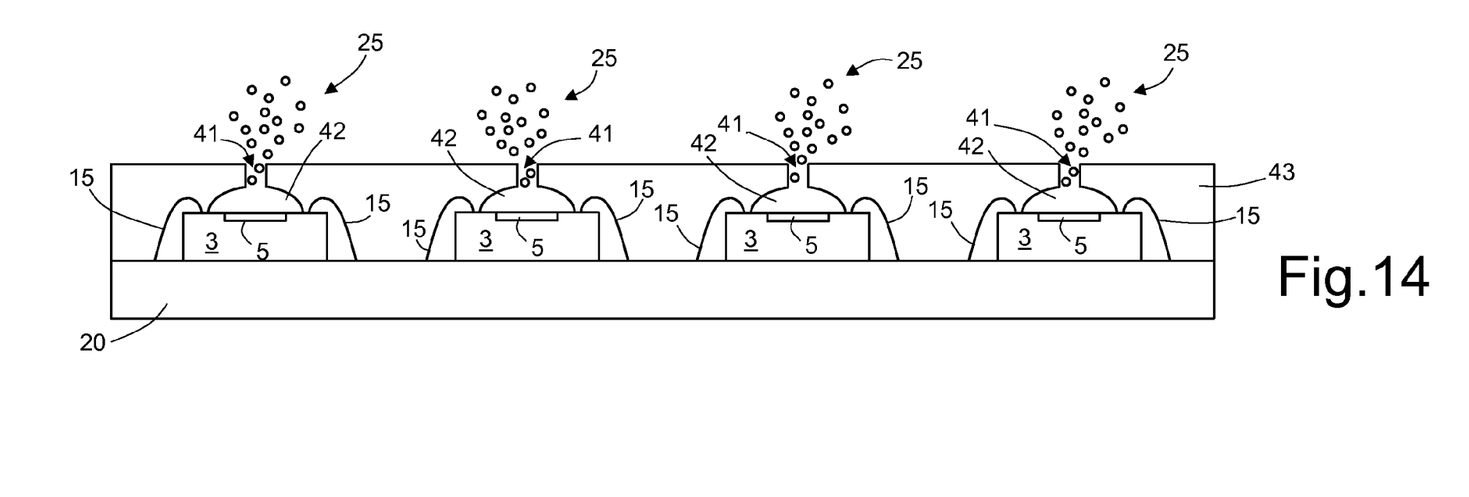

FIGS. 11-15 shows a different embodiment of the present process. Here, as shown in FIG. 11, each sacrificial drop 40 does not completely envelop a respective die 3, but extends over the sensitive area 5. Typically, the wetting area of the sacrificial drop 40 (i.e., the contact area between the sacrificial drop 40 and the main face 6 of the die 3) is greater than, and completely surrounds, the surface of the sensitive area 5.

Figure 15:
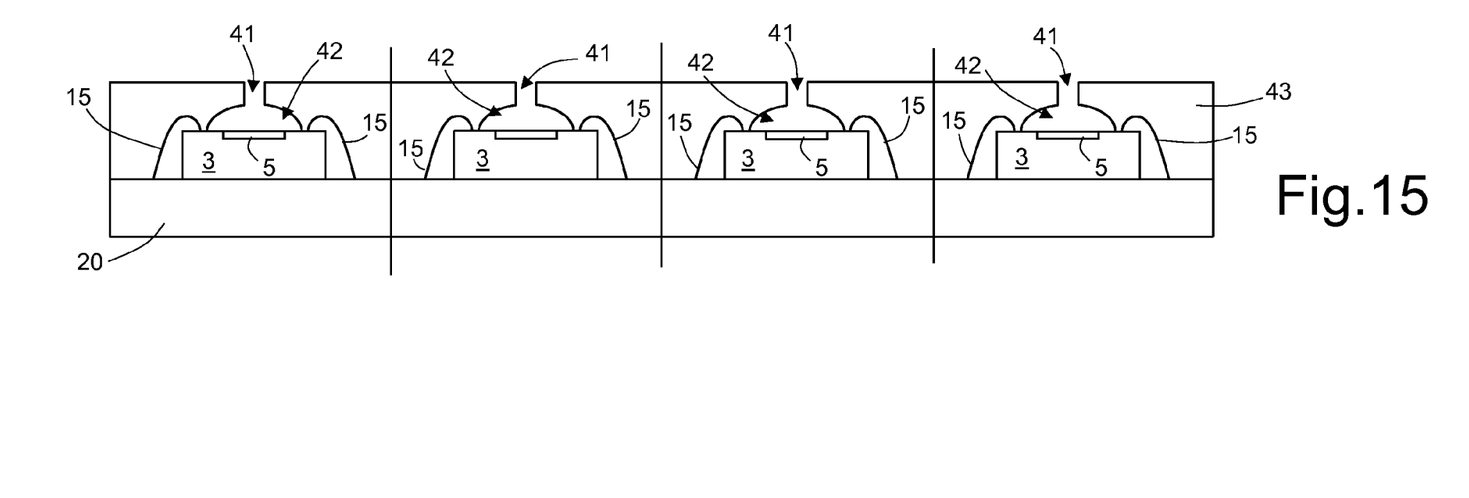

Next, steps similar to those previously described with reference to FIGS. 2, 4-7 are carried out (the barrier layer 13 is absent), and comprise molding the package layer 43 (FIG. 12); providing holes 41 (FIG. 13); removing the sacrificial drops 40 by evaporation or sublimation through the holes 41, thereby forming chambers 42 (FIG. 14); and singulation (FIG. 15). In this case, curing of the sacrificial drops 40 may take place also as a result of humidity.

Figure 16:
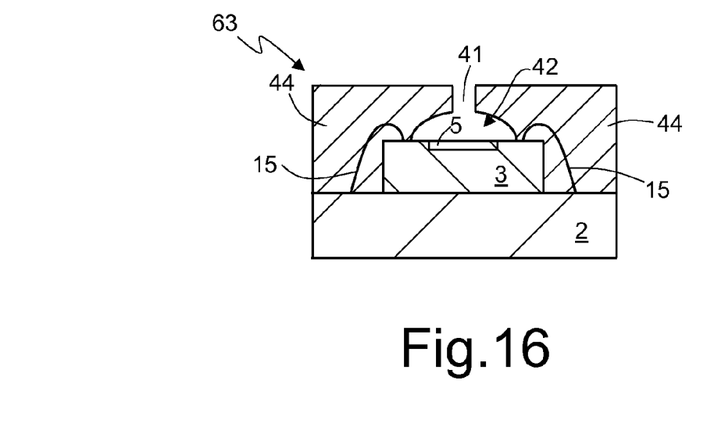
FIGS. 16 and 17 show different devices that may be obtained with the process of FIGS. 11-15.

A plurality of packaged devices 63 is thus formed, one whereof is shown in FIG. 16, where the chamber 42 and the hole 41 (surrounded by the packaging mass 44) expose the sensitive area 5 to the external environment. Also in this case, the sensitive area 5 may be obtained in any of the ways described above, and thus as a membrane suspended over the body 4 of the die 3, as in FIG. 8; as a membrane integrated in the body 4 of the die 3, as in FIG. 9; or as a layer deposited on the body 4 of the die 3, as in FIG. 10.

Figure 17:
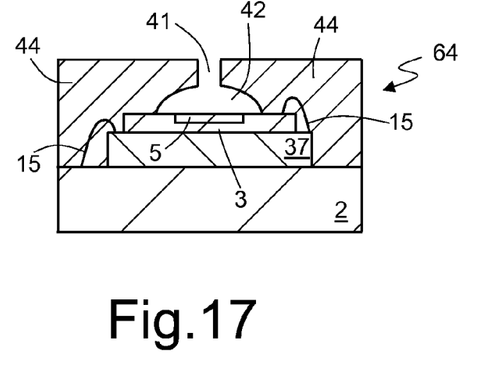

FIG. 17 shows a packaged device 64 of a stacked type, wherein the die 3 (also referred to as "first die 3" for clarity) is bonded on a second die 37, which is in turn bonded to the support 2. The second die 37 may form through vias (not shown) that connect the first die 3 to the support 2.

Alternatively, in particular if the second die 37 forms an integrated circuit, such as an ASIC, electrical interconnection wires (not shown) may extend between the first die 3 and the second die 37 and/or between the second die 37 and the support 2.

Figure 18:
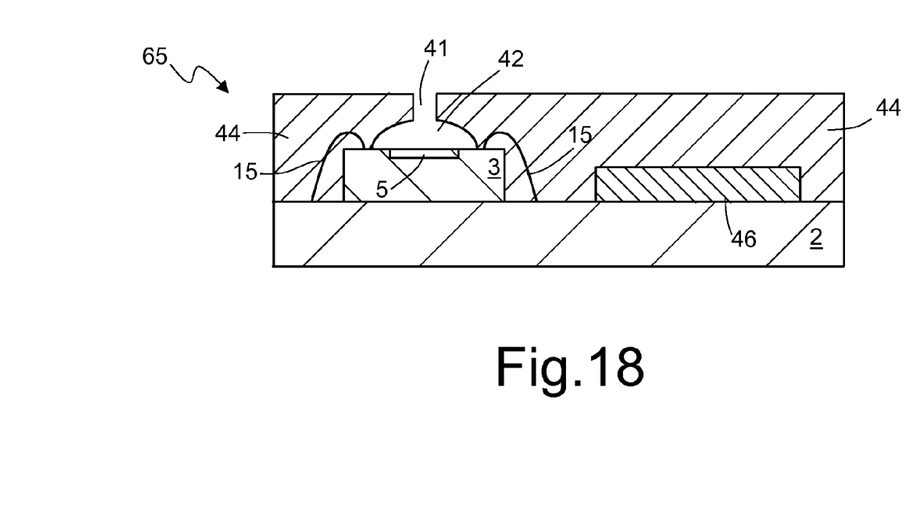
FIGS. 18-23 show cross-sections of a structure during successive steps for simultaneously packaging a plurality of devices, according to another embodiment of the present process.

FIG. 18 shows a packaged device 65 including a second die 46 bonded to the support 2 alongside the first die 3. Here, unlike the embodiment of FIG. 10, the second die 46 is completely embedded in the packaging mass 44 (apart from the side bonded to the support 2) and thus is not housed in the chamber 42.

Likewise, in case of the stacked configuration, a further possible die (not shown) bonded to the support 2 and carrying the first die 3 (sandwich configuration) would be surrounded by the packaging mass 44 and not housed in the chamber 42.

FIGS. 19-24 show another embodiment of the present process, where (similarly to FIGS. 11-15) each sacrificial drop 40 covers a part of the main face 6 of the die 3, including the sensitive area 5. Here, in particular, the electrical connection wires 15 are separately protected.

Figure 19:
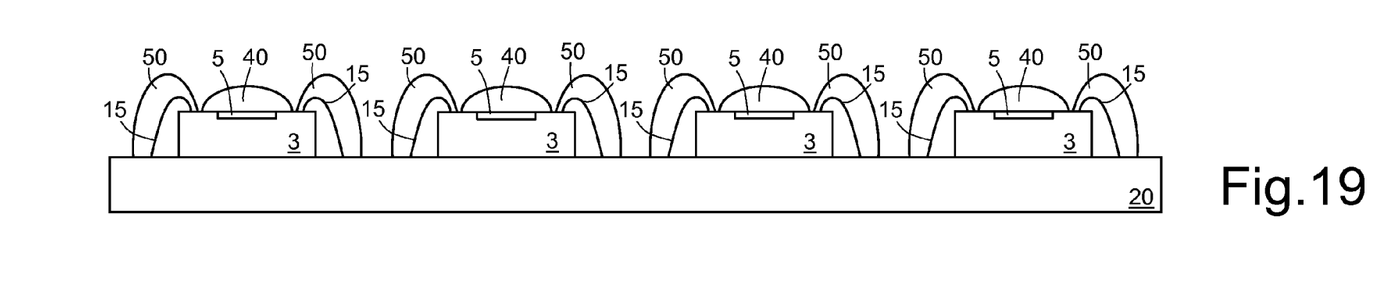
Figure 20:
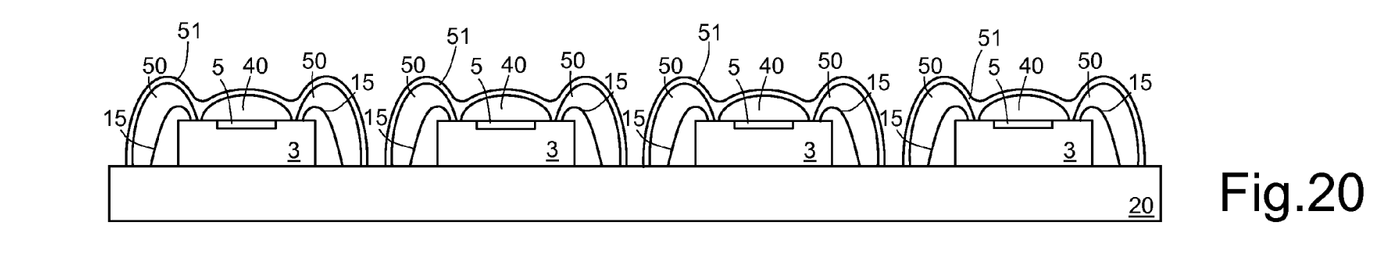
Figure 21:
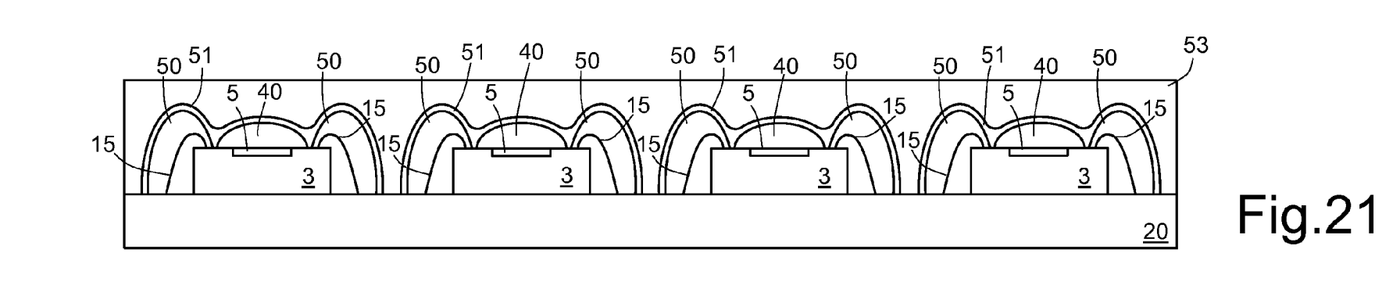
Figure 22:
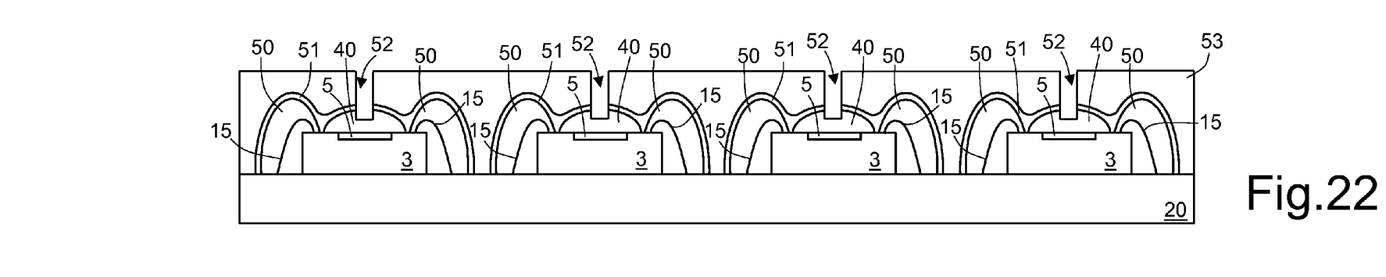
Figure 23:
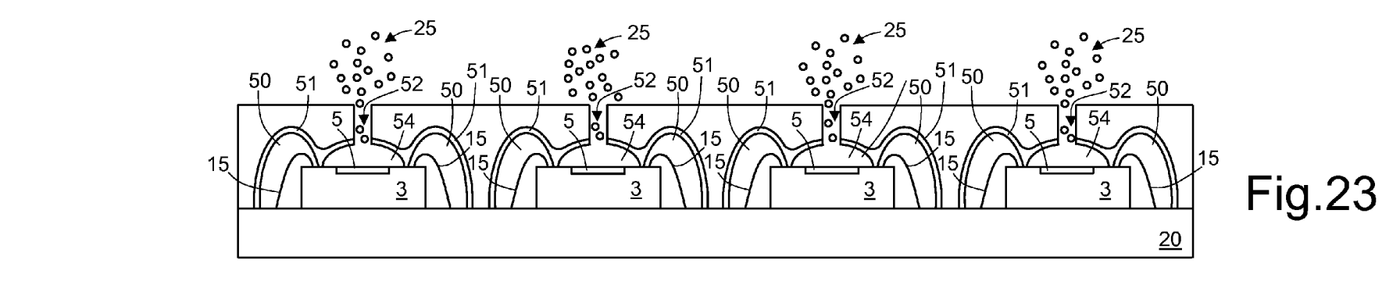

In detail, according to this embodiment, after dispensing the sacrificial drops 40 on the sensitive areas 5 of the dice 3 (as shown in FIG. 11), drops of packaging sealant compounds (glob-top masses 50), typically of epoxy resin, are dispensed on the electrical connection wires 15 (FIG. 19). In particular, the glob-top masses 50 may each cover one or more electrical connection wires 15, but in any case do not extend substantially over the sacrificial drops 40 (even if a minor overlapping is tolerated).

As an alternative to the above, it is possible first to provide the glob-top masses 50 and then the sacrificial drops 40, provided that it is possible to ensure that the glob top 50 does not cover the sensitive area 5.

Then (FIG. 20), a barrier layer 51 is deposited that here completely coats the glob-top drops 50 and the sacrificial drop 40 of each die 3. Also here, the barrier layer 51 may be a metal and be molded or sprayed, as described above.

Figure 24:
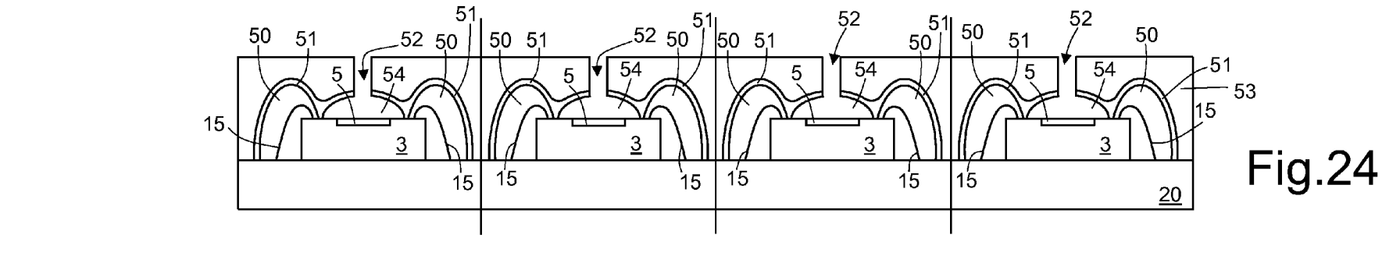
FIGS. 24-27 show different devices that may be obtained with the process of FIGS. 18-23.

Then steps similar to the ones described for the embodiment of FIGS. 3-7 are performed, including curing the material of the sacrificial drops 40; compression-molding a package layer 53 (FIG. 21); creating holes 52 (each of which extends through the package layer 43 and the barrier layer 51) (FIG. 22); removing the sacrificial drops 40 by evaporation or sublimation, thereby forming chambers 54 (FIG. 23); and singulation (FIG. 24).

Figure 25:
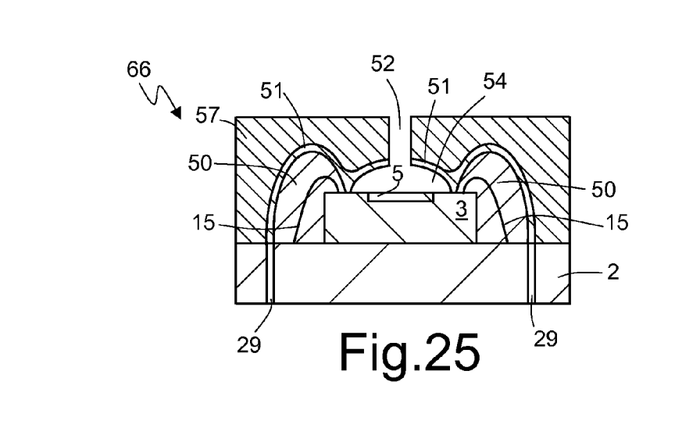

A plurality of packaged devices 66 is thus formed, one whereof is shown in FIG. 25, where the electrical connection wires 15 are protected by the glob-top drops 50 and are thus not exposed to the external environment even if the packaging mass 57 does not guarantee a sufficient hermetic seal. Also in this case, the sensitive area 5 may be obtained in any of the ways described above.

This solution is thus particularly suited when it is preferable to protect the electrical connection wires 15 from the external environment.

Figure 26:
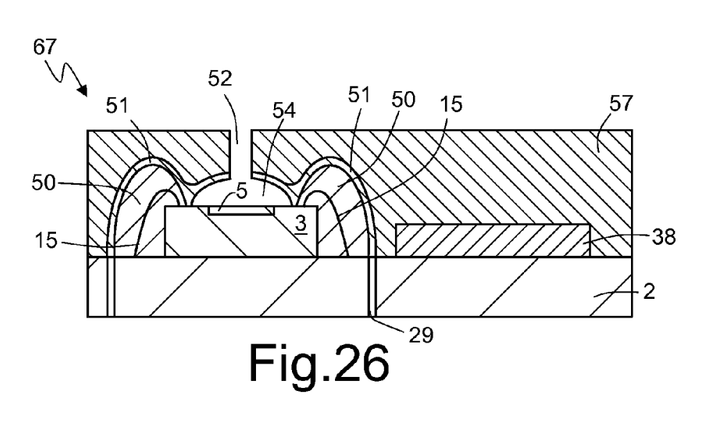

FIG. 26 shows an embodiment wherein the electrical connection wires 15 are covered by glob-top drops 50 and a second die 38 is bonded to the support 2 alongside the first die 3. Also here, the second die 38 is surrounded by the packaging mass 57 and is not housed in the chamber 42.

Figure 27:
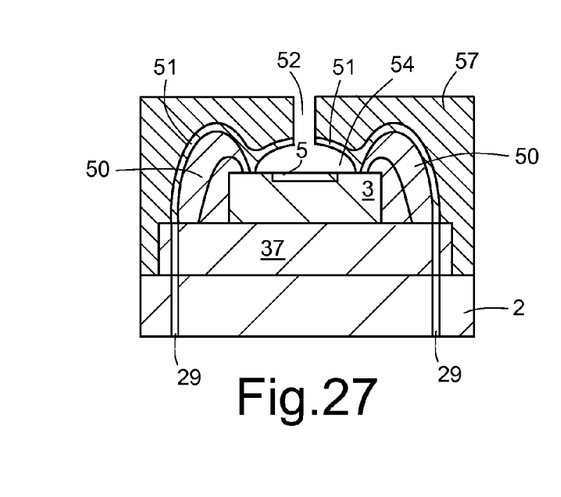

According to FIG. 27, a further die may be sandwiched between the first die 3 and the support 2, similarly to what shown in FIG. 10 or 17, with the connection wires 15 between the first and second dice and/or the connection wires between the second die and the substrate 2 covered by glob-top drops 50 surrounded by a barrier layer and by the packaging mass 10.

Finally, it is clear that modifications and variations may be made to the packaged device and to the manufacturing process described and illustrated herein, without thereby departing from the scope of the present disclosure.

In particular, as indicated, the type of packaged device may be any whatsoever, provided that it includes a chamber facing an area of the packaged die.

Moreover the position and number of dice and/or other structures within the chamber or in proximity of the packaged die may vary, as the presence or not of barrier layers and/or shielding layers and the type of electrical connections between the electronic and electrical components.

Finally, the packaged device may comprise a wide chamber as in FIGS. 1-10, with the wires 15 protected by glob-top drops, as in FIGS. 19-27.

Figure 28:
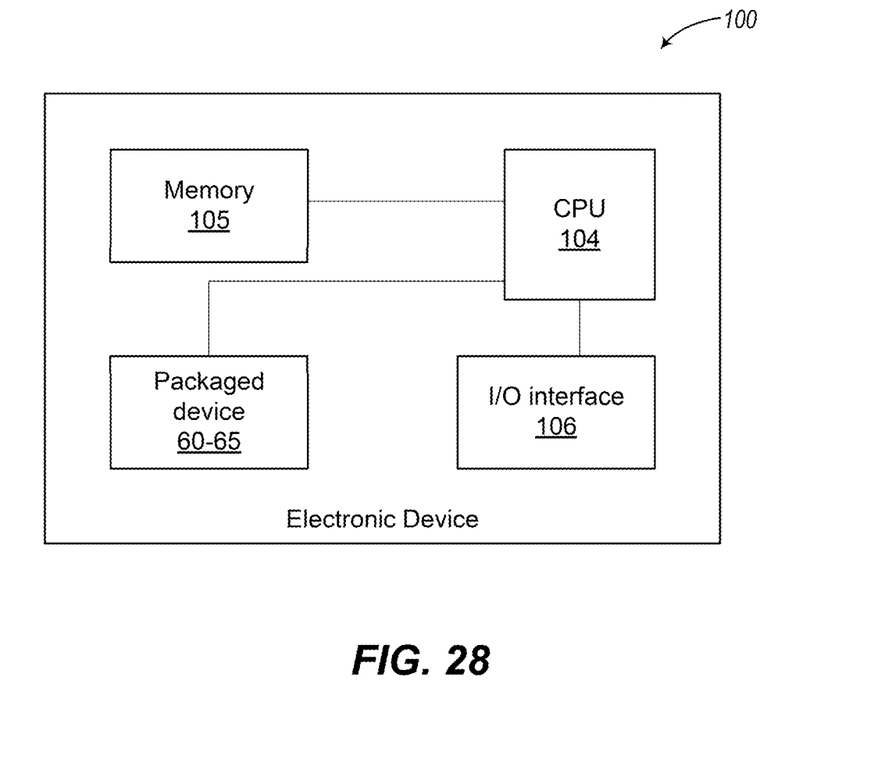
FIG. 28 is a block diagram for an electronic device that includes a packaged device according to an embodiment of the present disclosure.

FIG. 28 shows a block diagram of an electronic device 100 that includes at least one of the packaged devices, such as package devices 60-65. The electronic device further includes a microprocessor (CPU) 104 coupled to the packaged device. The electronic device may further include a memory 105 coupled to the microprocessor and an input/output interface 106, such as a keypad and/or display device, that is also coupled to the input/output interface 106. Furthermore, the electronic device 100 may further include a power source 108, such as a battery, or structure for coupling to an external power source. The electronic device 100 may be any electronic device that includes a package device, such as 60-65. For instance, the electronic device 100 may be a cell phone, personal digital assistant (PDA), wearable device, voice recorder, alarm and the like.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A packaged device comprising:
   a support;
   a first die coupled to the support, the first die having a sensitive region;
   a packaging mass of moldable material coupled to the support and surrounding the die, the packaging mass embedding a portion of the first die;
   a barrier layer abutting the packaging mass;
   sealing regions separated from the packaging mass by the barrier layer, electrical connection wires embedded in the sealing regions; and
   a chamber located between the packaging mass and the sensitive region, a surface of the barrier layer in the chamber facing a portion of the sensitive region, the chamber being in fluid communication with an environment outside of the packaged device, an inner surface of the packaging mass being exposed in the chamber.

2. The packaged device according to claim 1, wherein the chamber is in fluid communication with the environment outside of the packaged device through a hole extending through the packaging mass.

3. The packaged device according to claim 1, wherein the first die comprises a body of semiconductor material having a main face and side surfaces, the sensitive area faces the main face of the body, the chamber faces the main face, and the packaging mass surrounds sealing regions at side surfaces of the body.

4. The packaged device according to claim 1, wherein the first die comprises a body of semiconductor material having a main face and side surfaces, the sensitive region faces the main face of the body, and the chamber covers the sensitive region.

5. The packaged device according to claim 4, comprising a second die housed within the chamber.

6. The packaged device according to claim 5, wherein the second die is located between the support and the first die.

7. The packaged device according to claim 1, further comprising a second die and electrical connection wires having a first end coupled to the first die and a second end coupled to one of the support and the second die, the electrical connection wires being embedded in sealing regions.

8. The packaged device according to claim 1, further includes a barrier layer facing the chamber, wherein the chamber is formed in part by a lateral delimitation wall of the barrier layer.

9. The packaged device according to claim 8, wherein the barrier layer is a polymer or conductive ink.

10. The packaged device according to claim 1, wherein the packaged device is one of a pressure sensor, a microphone, a humidity sensor, a gas sensor, and a chemical sensor.

11. An electronic device, comprising:
    a microprocessor;

a packaged device coupled to the microprocessor, the packaged device including:
a support;
a first die coupled to the support, the first die having a first surface including a sensitive region and side surfaces;
connection wires coupling the first die to the support;
a sealing region, the connection wires embedded in the sealing region;
molded resin coupled to the support and surrounding the first and side surfaces of the first die, the molded resin including an access port;
a conductive layer between the packaging mass and the sealing region; and
a chamber located between the molded resin and the sensitive region, the chamber in fluid communication with an environment outside of the packaged device by the access port of the packaging mass.

12. The electronic device according to claim 11, wherein the packaged device further includes a barrier layer between the packaging mass and the chamber.

13. The electronic device according to claim 11, wherein the packaged device further comprising a second die including an integrated circuit between the first die and the support.

14. The electronic device according to claim 11, wherein the electronic device is at least one of a cell phone, personal digital assistant (PDA), wearable device, voice recorder, and alarm.

15. A packaged device comprising:
a support;
a first die coupled to the support, the first die having a sensitive region at a first surface, the first die coupled to the support by connection wires;
a packaging mass of moldable material coupled to the support and covering the first die;
sealing regions, the connection wires embedded in the sealing regions;
a barrier layer between the packaging mass and the sealing regions;
the packaging mass having a through hole;
a chamber located between the packaging mass and the sensitive region, the chamber being in fluid communication with an environment outside of the packaged device by the through hole of the packaging mass; and
a second die and electrical connection wires having a first end coupled to the first die and a second end coupled to one of the support and the second die.

16. The packaged device according to claim 15, wherein the chamber is formed in part by a lateral delimitation wall of the barrier layer.

17. The packaged device according to claim 15, wherein the barrier layer is a polymer or conductive ink.

18. The packaged device according to claim 15, wherein the packaged device is one of a pressure sensor, a microphone, a humidity sensor, a gas sensor, and a chemical sensor.

19. The packaged device according claim 15, wherein the sealing regions and the packaging mass are different materials.

20. A packaged device comprising:
a support;
a first die coupled to the support, the first die having a sensitive region;
electrical connection wires electrically coupling the first die to the support;
sealing regions, the electrical connection wires embedded in the sealing regions;
a conductive layer covering the sealing regions;
a packaging mass of moldable material coupled to the support and covering a portion of the die and the conductive layer;
a chamber located between the packaging mass and the sensitive region, the packaging mass covering the chamber and a portion of the sensitive region on the first die; and
a hole extending though the packaging mass and placing the chamber in fluid communication with an environment outside of the packaged device, a surface of the packaging mass defining the hole.

21. The packaged device according to claim 20, wherein the first die comprises a body of semiconductor material having a main face and side surfaces, the sensitive area faces the main face of the body, the chamber faces the main face, and the sealing regions surround side surfaces of the body.

22. The packaged device according to claim 20, wherein the conductive layer is a polymer or conductive ink.

23. The packaged device according to claim 20, wherein the packaged device is one of a pressure sensor, a microphone, a humidity sensor, a gas sensor, and a chemical sensor.

24. The packaged device according to claim 20, wherein the conductive layer is a barrier layer between the packaging mass and the chamber.

25. The packaged device of claim 24, further comprising a surface of the barrier layer defining the hole, the surface of the packaging mass having a first edge and the surface of the barrier layer having a second edge, the first edge and the second edge being coincident.

* * * * *

UNITED STATES PATENT AND TRADEMARK OFFICE
CERTIFICATE OF CORRECTION

Page 1 of 1

PATENT NO.         : 9,708,174 B2
APPLICATION NO.    : 14/341458
DATED              : July 18, 2017
INVENTOR(S)        : Federico Giovanni Ziglioli It is certified that error appears in the above-identified patent and that said Letters Patent is hereby corrected as shown below:

In the Claims

Column 8, Line 39:
"and the packaging mass surrounds sealing regions at side surfaces of the body." should read, --and the sealing regions at side surfaces of the body.--.

Signed and Sealed this
Thirtieth Day of January, 2018

Joseph Matal
*Performing the Functions and Duties of the*
*Under Secretary of Commerce for Intellectual Property and*
*Director of the United States Patent and Trademark Office*